(12) United States Patent
Zhong et al.

(10) Patent No.: US 8,431,461 B1
(45) Date of Patent: Apr. 30, 2013

(54) SILICON NITRIDE DRY TRIM WITHOUT TOP PULLDOWN

(75) Inventors: Qinghua Zhong, Fremont, CA (US); Yoshie Kimura, Castro Valley, CA (US); Tae Won Kim, Dublin, CA (US); Qian Fu, Pleasanton, CA (US); Gladys Lo, Fremont, CA (US); Ganesh Upadhyaya, Fremont, CA (US); Yoko Yamaguchi, Union City, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/329,035

(22) Filed: Dec. 16, 2011

(51) Int. Cl.
*H01L 21/336* (2006.01)

(52) U.S. Cl.
USPC .................. 438/303; 257/E21.626

(58) Field of Classification Search .......... None
See application file for complete search history.

(56) References Cited

U.S. PATENT DOCUMENTS

| | | | |
|---|---|---|---|
| 6,821,713 B1* | 11/2004 | Holbrook et al. | 430/313 |
| 7,294,581 B2 | 11/2007 | Iyer et al. | |
| 7,838,426 B2 | 11/2010 | Goyal et al. | |
| 8,039,388 B1 | 10/2011 | Ng et al. | |
| 2011/0244398 A1 | 10/2011 | Huang et al. | |

* cited by examiner

*Primary Examiner* — Seahvosh Nikmanesh
(74) *Attorney, Agent, or Firm* — Beyer Law Group LLP

(57) ABSTRACT

A method for forming devices with silicon gates over a substrate is provided. Silicon nitride spacers are formed on sides of the silicon gates. An ion implant is provided using the silicon nitride spacers as masks to form ion implant regions. A nonconformal layer is selectively deposited over the spacers and gates that selectively deposits a thicker layer on tops of the gates and spacers and between spacers than on sidewalls of the silicon nitride spacers. Sidewalls of the nonconformal layer are etched away on sidewalls of the silicon nitride spacers. The silicon nitride spacers are trimmed.

19 Claims, 5 Drawing Sheets

SILICON NITRIDE DRY TRIM WITHOUT TOP PULLDOWN

BACKGROUND OF THE INVENTION

Field of the Invention

The invention relates to a method of forming semiconductor devices on a semiconductor wafer. More specifically, the invention relates to forming semiconductor devices with silicon gates near doped silicon regions.

In forming semiconductor devices, silicon nitride spacers adjacent to silicon gates are used as ion implant masks.

SUMMARY OF THE INVENTION

To achieve the foregoing and in accordance with the purpose of the present invention, a method for forming devices with silicon gates over a substrate is provided. Silicon nitride spacers are formed on sides of the silicon gates. An ion implant is provided using the silicon nitride spacers as masks to form ion implant regions. A nonconformal layer is selectively deposited over the spacers and gates that selectively deposits a thicker layer on top of the gates and spacers and between spacers than on sidewalls of the silicon nitride spacers. Sidewalls of the nonconformal layer are etched away on sidewalls of the silicon nitride spacers. The silicon nitride spacers are trimmed, however silicon nitride spacer top is not etched.

In another manifestation of the invention, a method for forming devices with silicon gates over a substrate is provided. Silicon nitride spacers are formed on sides of the silicon gates. An ion implant is provided using the silicon nitride spacers as masks to form ion implant regions. A nonconformal layer is selectively deposited over the spacers and gates that selectively deposits a thicker layer on tops of the gates and spacers and between spacers than on sidewalls of the silicon nitride spacers, wherein the nonconformal layer is at least one of silicon oxide, silicon nitride, or polymer. Sidewalls of the nonconformal layer on sidewalls of the silicon nitride spacers are etched away. The silicon nitride spacers are trimmed. Parts of the nonconformal layer on top of the gates and spacers and on the substrate are removed to provide exposed silicon regions on top of the silicon gates and on the substrate. A metal layer is deposited. The metal layer is annealed to form metal silicide at the exposed silicon regions.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
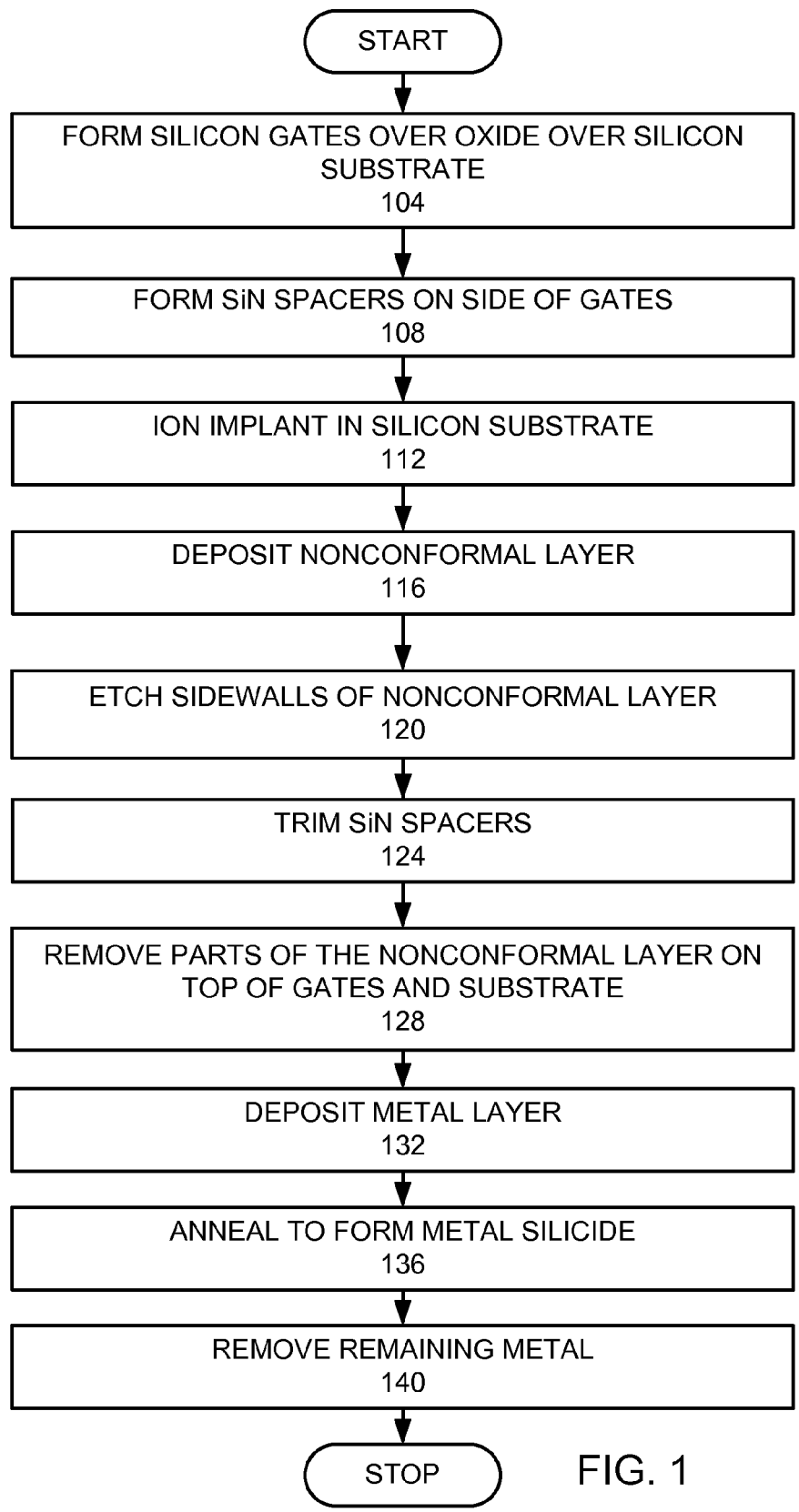
FIG. 1 is a flow chart of an embodiment of the invention.

FIG. 1 is a high level flow chart of an embodiment of the invention. In this embodiment, silicon gates are formed over an oxide layer over a silicon substrate (step 104). Silicon nitride (SiN) spacers are formed on the sides of the silicon gates (step 108). An ion implant is provided to implant ions into the silicon substrate, while using the SiN spacers as masks (step 112). A nonconformal layer is selectively deposited over the SiN spacers, gates and substrate, where the selective deposition deposits more on the tops of the SiN spacers, gates, and substrate than the sidewalls of the spacers (step 116). The sidewalls of the nonconformal layer are etched (step 120). The SiN spacers are trimmed (step 124). Parts of the nonconformal layer on top of the gates, spacers, and substrate are removed (step 128). A metal layer is deposited over the tops of the gates and substrate (step 132). The metal is annealed to form metal silicide (step 136). Remaining metal is removed (step 140).

Figure 2A:
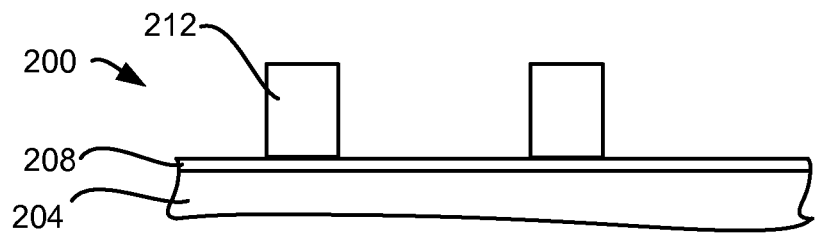
FIGS. 2A-H are schematic views of the formation of structures using the inventive process.

In a preferred embodiment of the invention, silicon gates are formed over an oxide layer over a silicon substrate (step 104). FIG. 2A is a cross-sectional view of a stack 200 with a silicon substrate 204 with an oxide layer 208 over which polysilicon gates 212 are formed. In this example the silicon substrate is a silicon wafer. In other embodiments one or more other layers other than a silicon oxide layer may be between the gates and the silicon substrate.

Figure 2B:
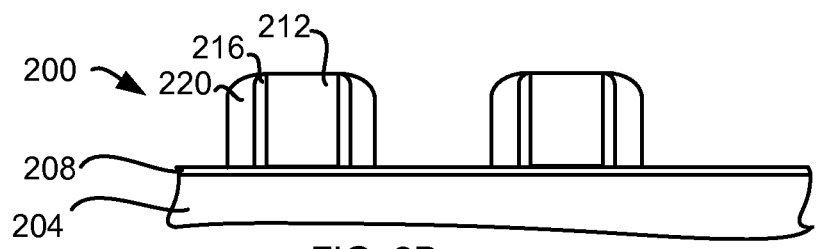

SiN spacers are form on sides of the gates (step 108). In this embodiment, silicon oxide spacers are first formed on sides of the gates. This may be accomplished by depositing a silicon oxide layer over the gates and etching the tops of the silicon oxide layer to form silicon oxide spacers. Then SiN spacers are formed over the silicon oxide spacers and the sides of the polysilicon gates. This may be accomplished by depositing a SiN layer over the gates and silicon oxide spacers and then etching the tops of the SiN layer. FIG. 2B is a cross-sectional view of the stack 200, where silicon oxide spacers 216 are formed on sides of the polysilicon gates 212 and SiN spacers 220 are formed on the sides of the silicon oxide spacers 216 and polysilicon gates 212.

Figure 2C:
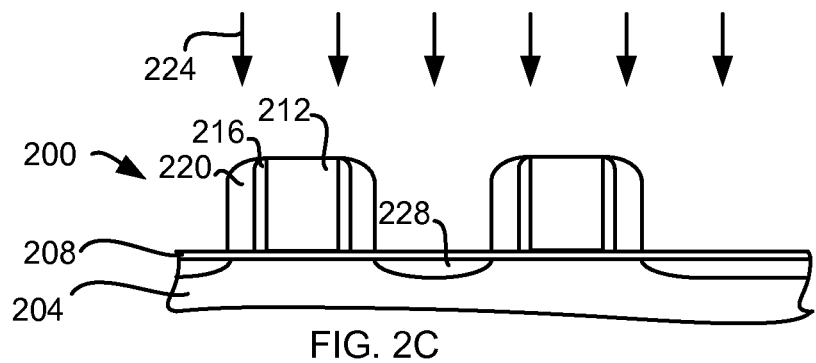

An ion implant is provided to the silicon substrate (step 112) to form doped regions of the silicon substrate where the SiN spacers are used as a mask. Generally, ions are accelerated to the substrate forming doped regions in the substrate in areas not covered by the SiN spacers, silicon oxide spacers, or gates. FIG. 2C illustrates how ions 224 are directed towards the silicon substrate 204 to form doped ion implant regions 228 in the silicon substrate.

Figure 2D:
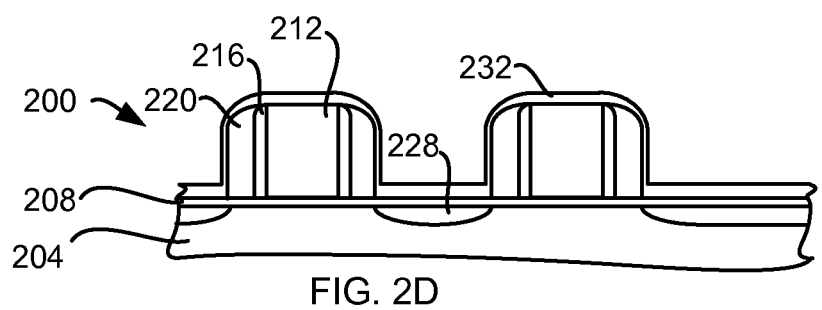

A nonconformal layer is selectively deposited over the SiN spacers, the gates, the silicon oxide spacers, and the substrate (step 116), where the selective deposition deposits more on top of the SiN spacers, the silicon oxide spacers, the gates, and the substrate than on the sidewalls of the SiN spacers. In this embodiment, chemical vapor deposition (CVD) is used to provide the selective deposition of the nonconformal layer. The CVD can be either in-site or ex-site deposition in etch chamber. In this embodiment, the nonconformal layer is silicon nitride. An example of a recipe for providing the nonconformal layer of silicon nitride a pressure of 50 mTorr is provided. A deposition gas of $SiCl_4$ and $N_2$ or $SiH_4$ and $N_2$ is flowed into the plasma chamber. A radio frequency (RF)

power signal of 400 watts TCP is provided to transform the etch gas into a plasma. A bias of 75 volts is also provided. The process is maintained for 15 seconds. In an alternative embodiment where the nonconformal layer is silicon oxide 50 sccm SiCl$_4$ and 50 sccm O$_2$ is flowed as the deposition gas. In another embodiment, where the nonconformal layer is C$_x$H$_y$F$_z$ then the deposition gas may be CH$_4$ and CH$_x$F$_y$, and H$_2$. Providing a high bias of 75 volts facilitates the deposition of a nonconformal layer, where the bias helps to selectively deposit on the tops of the gates and bottoms of the features with respect to the sidewalls. FIG. 2D illustrates the stack after the nonconformal layer 232 is deposited.

The sidewalls of the nonconformal layer 232 are etched, so that the sidewalls of the nonconformal layer 232 are removed while leaving some of the tops and bottoms of the nonconformal layer 232 (step 120). In this example, the etching is provided in a plasma processing system.

Figure 3:
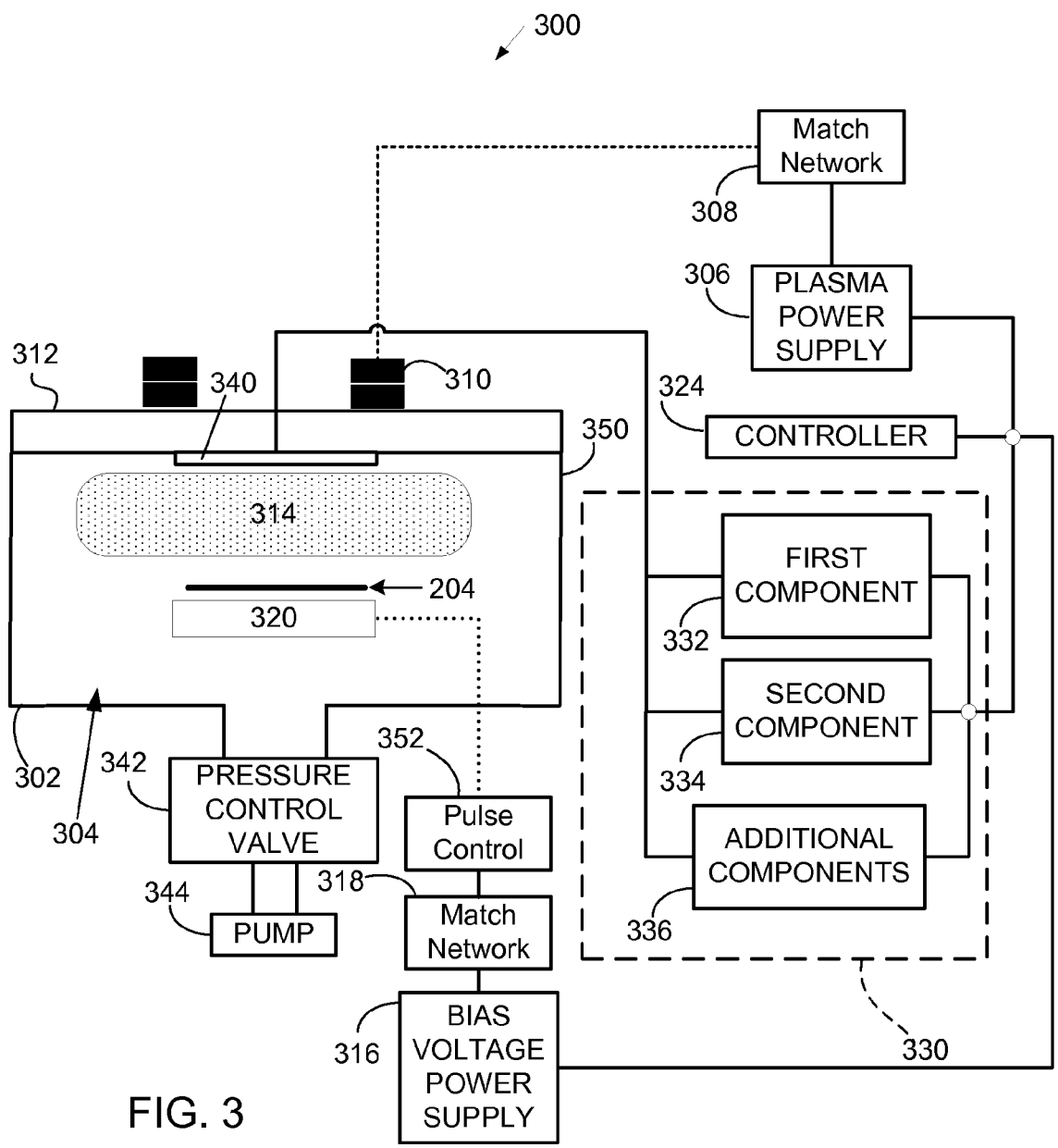
FIG. 3 is a schematic view of a plasma processing chamber that may be used in an embodiment of the invention.

FIG. 3 schematically illustrates an example of a plasma processing system 300 which may be used in one embodiment of the present invention. The plasma processing system 300 includes a plasma reactor 302 having a plasma processing chamber 304 therein defined by a chamber wall 350. A plasma power supply 306, tuned by a match network 308, supplies power to a TCP coil 310 located near a power window 312 to be an electrode that provides power to the plasma processing chamber 304 to create a plasma 314 in the plasma processing chamber 304. The TCP coil (upper power source) 310 may be configured to produce a uniform diffusion profile within processing chamber 304. For example, the TCP coil 310 may be configured to generate a toroidal power distribution in the plasma 314. The power window 312 is provided to separate the TCP coil 310 from the plasma chamber 304 while allowing energy to pass from the TCP coil 310 to the plasma chamber 304. A wafer bias voltage power supply 316 tuned by a match network 318 provides power to an electrode 320 to set the bias voltage on the silicon substrate 204 which is supported by the electrode 320, so that the electrode 320 in this embodiment is also a substrate support. A pulse controller 352 causes the bias voltage to be pulsed. The pulse controller 352 may be between the match network 318 and the substrate support or between the bias voltage power supply 316 and the match network 318 or between the controller 324 and the bias voltage power supply 316 or in some other configuration to cause the bias voltage to be pulsed. A controller 324 sets points for the plasma power supply 306 and the wafer bias voltage supply 316.

The plasma power supply 306 and the wafer bias voltage power supply 316 may be configured to operate at specific radio frequencies such as, for example, 13.56 MHz, 27 MHz, 2 MHz, 400 kHz, or combinations thereof. Plasma power supply 306 and wafer bias power supply 316 may be appropriately sized to supply a range of powers in order to achieve desired process performance. For example, in one embodiment of the present invention, the plasma power supply 306 may supply the power in a range of 300 to 10000 Watts, and the wafer bias voltage power supply 316 may supply a bias voltage in a range of 10 to 2000 V. In addition, the TCP coil 310 and/or the electrode 320 may be comprised of two or more sub-coils or sub-electrodes, which may be powered by a single power supply or powered by multiple power supplies.

As shown in FIG. 3, the plasma processing system 300 further includes a gas source/gas supply mechanism 330. The gas source includes a first component gas source 332, a second component gas source 334, and optionally additional component gas sources 336. The various component gases will be discussed below. The gas sources 332, 334, and 336 are in fluid connection with processing chamber 304 through a gas inlet 340. The gas inlet may be located in any advantageous location in chamber 304, and may take any form for injecting gas. Preferably, however, the gas inlet may be configured to produce a "tunable" gas injection profile, which allows independent adjustment of the respective flow of the gases to multiple zones in the process chamber 304. The process gases and byproducts are removed from the chamber 304 via a pressure control valve 342, which is a pressure regulator, and a pump 344, which also serves to maintain a particular pressure within the plasma processing chamber 304 and also provides a gas outlet. The gas source/gas supply mechanism 330 is controlled by the controller 324. A Kiyo system by Lam Research Corporation may be used to practice an embodiment of the invention.

Figure 4:
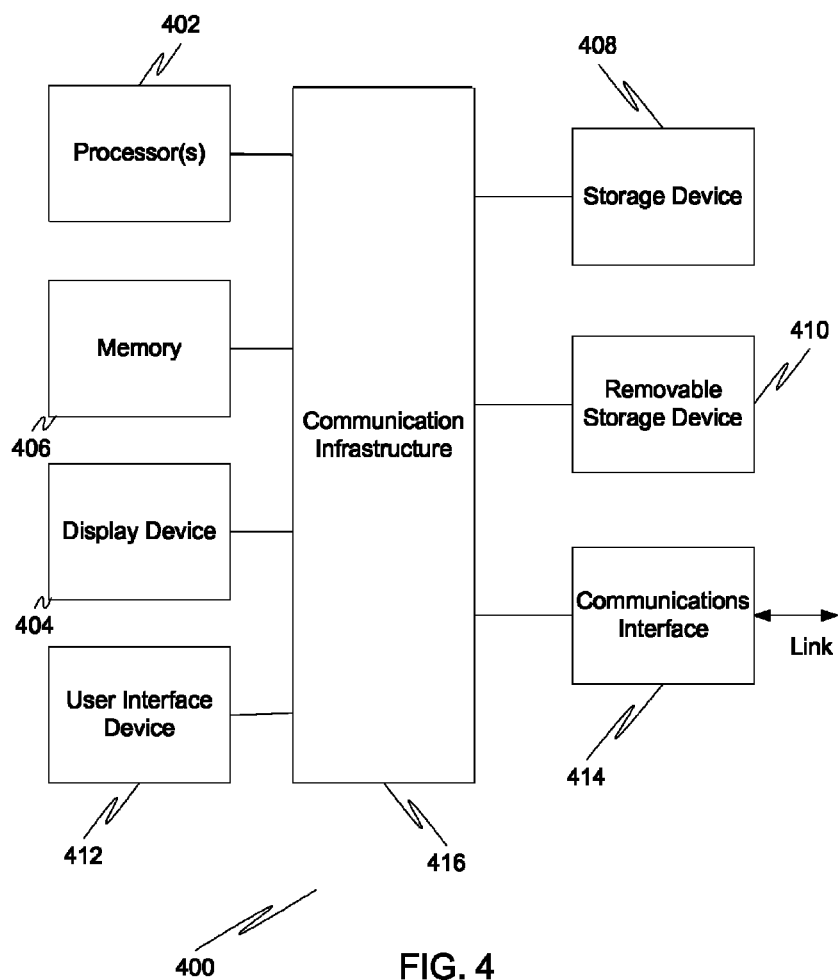
FIG. 4 is a schematic view of a computer system that may be used in practicing the invention.

FIG. 4 is a high level block diagram showing a computer system 400, which is suitable for implementing a controller 324 used in embodiments of the present invention. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2E:
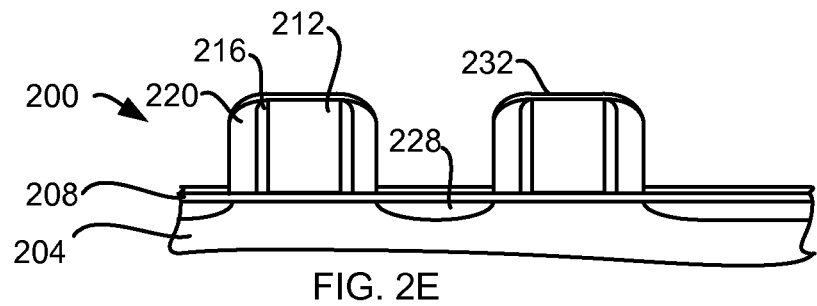

FIG. 2E is a cross-sectional view of the stack 200 after the nonconformal layer has been etched. The sidewalls of the nonconformal layer have been removed, but the some of the nonconformal layer 232 on top of the gates and over the substrate remains. An example recipe for etching sidewalls of a silicon nitride nonconformal layer provides a pressure of 50 mTorr. A SiN trim gas of $CH_3F$ and $O_2$ is flowed into the plasma processing chamber. The trim gas is formed into a plasma, which selectively removes sidewalls of the nonconformal layer with respect to the nonconformal layer on top of the gates and the bottom of the features.

In other embodiments, where the nonconformal layer is SiO, the trim gas comprises $CF_4$ and $O_2$. Preferably, the ratio of $CF_4$ and $O_2$ is from 5:1 to 20:1. More preferably, the ratio of $CF_4$ and $O_2$ is about 10:1. In other embodiments, where the nonconformal layer is $C_xH_yF_z$, the trim gas comprises $H_2$, $CF_4$ and $O_2$. Preferably, the ratio of $O_2$ and $CF_4$ is from 5:1 to 20:1. More preferably, the ratio of $CF_4$ and $O_2$ is about 10:1.

The SiN spacers are trimmed (step 124). In this embodiment, the SiN trim removes the remaining nonconformal layer and etches only the sidewalls of the SiN spacers 220. Preferably, at least 1.5 nm of the sidewalls is etched away. More preferably, at least 2.5 nm of the sidewall is etched away. Preferably, none of the tops of the silicon oxide spacers is etched away. In this embodiment the SiN spacer trim is performed in the same chamber 300 as the etching of the sidewalls of the nonconformal layer. In other embodiments different chambers may be used for different steps.

An example of a SiN trim recipe provides a pressure of 50 mTorr. A SiN trim gas of $CH_3F$ and $O_2$ is flowed into the plasma processing chamber. The trim gas is formed into a plasma, which selectively removes sidewalls of the nonconformal layer with respect to the nonconformal layer on top of the gates and the bottom of the features.

Figure 2F:
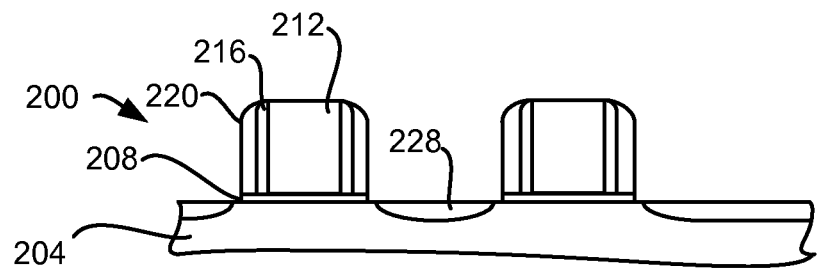

FIG. 2F is a cross-sectional view of the stack 200 after SiN layer has been trimmed during the trim of the SiN spacers. Because in this embodiment, the nonconformal layer is SiN the parts of the nonconformal layer on top of the gates and substrates is removed (step 128) during the SiN trim (step 124). An additional oxide clean may be provided after removing parts of the nonconformal layer on top of the gates and substrates (step 128) before depositing the layer of nickel. The oxide clean is provided to expose the substrate 204 to allow the formation of NiSi. This oxide clean may be accomplished by a wet etch using a solution of $H_2O_2$, $H_2O$ and $H_xSO_y$, is used to clean the organic material. Then a solution of HF and $H_2O$ is used to clean and etch the $SiO_2$.

Figure 2G:
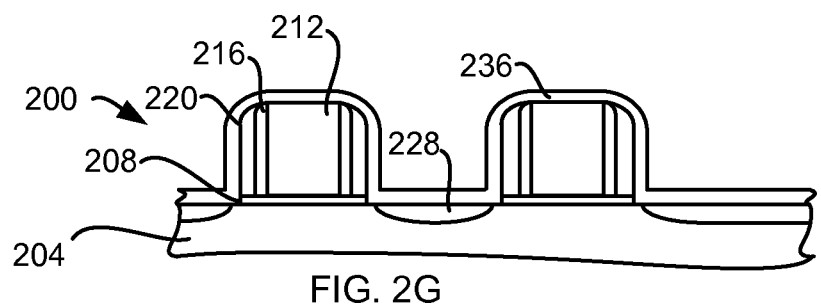

A layer of metal is deposited over the stack 200 (step 132). In a preferred embodiment, the nickel is deposited by physical vapor deposition (PVD). In other embodiments, the nickel may be deposited by other methods. FIG. 2G is a cross-sectional view of the stack 200 after a layer of nickel 236 has been deposited.

The stack 200 is annealed (step 136) to form nickel silicide (NiSi) where nickel is in contact with silicon, which is on top of the silicon gates and on exposed parts of the substrate. In an embodiment, the annealing is accomplished by heating the nickel to a temperature between 200° C. and 700° C.

Figure 2H:
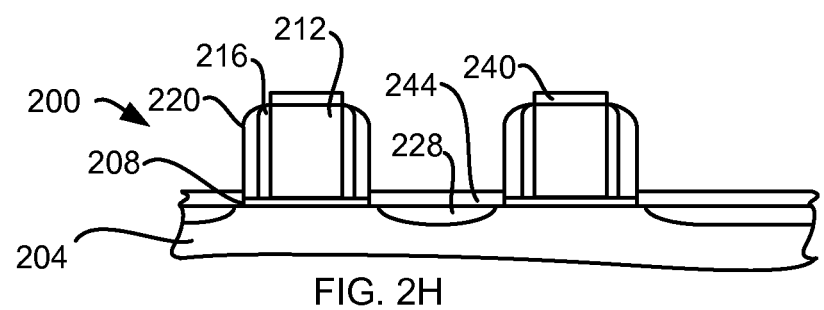

After the annealing, the remaining nickel is etched away (step 140). In an embodiment, the etching is accomplished by providing a wet etch using a potassium hydroxide solution. FIG. 2H shows the stack 200 after the remaining nickel is etched away leaving only the NiSi on top of the gates 240 and NiSi between the spacers 244.

It should be noted that over the substrate 204, the area covered by the NiSi 244 is larger than the area of the doped region 228. This is accomplished by etching back the SiN spacer 220 after the ion implant and before depositing the nickel layer 236. The larger area lowers resistance and provides better NiSi formation. The larger area also allows a better connection between the NiSi and a subsequent metal contact, which increases contact yield. It should also be noted that the NiSi 240 deposited on top of the gates 212 does not extend down the sides of the gates. Without aspects of the invention, the tops of the SiN spacers 220 and silicon oxide spacers 216 may be etched away, which exposes sides of the gates 212. This would allow nickel to contact sides at the top of the gates 212, which would cause NiSi to form on some of the sides of the gates, which would provide too much NiSi on top of the gates, which could cause electric shorts between gates and contactors Therefore, this embodiment of the invention enlarges the area of the NiSi deposited between the bottoms of the spacers without increasing the area of NiSi on top of the gates.

Additional processing steps are provided to complete the semiconductor devices. For example, in one embodiment, the silicon nitride and silicon oxide spacers are etched away, leaving the silicon gate.

Preferably, the NiSi region will have a diameter that is at least 3 nm greater than the diameter of the doped region. More preferably, the NiSi region will have a diameter that is 3 nm to 10 nm greater than the diameter of the doped region. Most preferably the diameter of the NiSi region is between 5 to 10 nm greater than the diameter of the NiSi region.

In another embodiment of the invention, a hardmask of silicon oxide or SiN is formed on top of the silicon gates. Such hardmasks may be used for replacement gate stacks. In one embodiment a thin silicon nitride layer may be placed on top of replacement gates, and then a thicker silicon oxide layer is formed over the silicon nitride layer. During the manufacturing process, the thicker silicon oxide hardmask layer is removed leaving the thin silicon nitride layer to protect the replacement gate. The invention prevents the etching of tops of silicon nitride spacers while trimming sidewalls of the silicon nitride spacers to limit exposure of the sides of the silicon gates to reduce shorting.

In other embodiments, the metal used to form the metal silicide may be titanium, cobalt, platinum, or tungsten. Generally a bias is provided to facilitate the selective deposition of the nonconformal layer. Preferably, the bias is greater than 50 volts. More preferably, the bias is at least 75 volts.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method for forming devices with silicon gates over a substrate, comprising:
    forming silicon nitride spacers on sides of the silicon gates;
    providing an ion implant using the silicon nitride spacers as masks to form ion implant regions;
    selectively depositing a nonconformal layer over the spacers and gates that selectively deposits a thicker layer on tops of the gates and spacers and between spacers than on sidewalls of the silicon nitride spacers;
    etching away sidewalls of the nonconformal layer on sidewalls of the silicon nitride spacers; and
    trimming the silicon nitride spacers.

2. The method, as recited in claims 1, further comprising:
    removing parts of the nonconformal layer on top of the gates and spacers and on the substrate to provide exposed silicon regions on top of the silicon gates and on the substrate;

depositing a metal layer; and annealing the metal layer to form metal silicide at the exposed silicon regions.

3. The method, as recited in 2, wherein metal silicide is formed between the silicon nitride spacers and where the metal silicide formed between the silicon nitride spacers has a larger area than an area of the ion implant regions and wherein the nonconformal layer prevents etching of the tops of the silicon nitride spacers.

4. The method, as recited in claim 3, wherein the area of the metal silicide is at least 3 nm wider than the area of the ion implant regions.

5. The method, as recited in claim 4, wherein the nonconformal layer is at least one of silicon oxide, silicon nitride, or polymer.

6. The method, as recited in claim 5, further comprising an oxide clean after trimming the silicon nitride spacers.

7. The method, as recited in claim 5, wherein the trimming selectively etches the silicon nitride spacers with respect to the nonconformal layer.

8. The method, as recited in claim 5, wherein the removing parts of the nonconformal layer on top of the gates and spacers and on the substrate is provided simultaneously with the trimming the silicon nitride spacers.

9. The method, as recited in claim 5, wherein the substrate is a silicon wafer.

10. The method, as recited in claim 9, wherein the silicon gates are polysilicon gates.

11. The method, as recited in claim 5, wherein the metal layer is at least one of nickel, titanium, cobalt, platinum, or tungsten.

12. The method, as recited in claim 5, wherein the metal layer is nickel.

13. The method, as recited in claim 2, wherein the metal layer is at least one of nickel, titanium, cobalt, platinum, or tungsten.

14. The method, as recited in claim 2, wherein the metal layer is nickel and the metal silicide is NiSi.

15. The method, as recited in claim 2, wherein the selectively depositing the nonconformal layer comprises providing a bias greater than 50 volts.

16. A method for forming devices with silicon gates over a substrate, comprising:

forming silicon nitride spacers on sides of the silicon gates;

providing an ion implant using the silicon nitride spacers as masks to form ion implant regions;

selectively depositing a nonconformal layer over the spacers and gates that selectively deposits a thicker layer on tops of the gates and spacers and between spacers than on sidewalls of the silicon nitride spacers, wherein the nonconformal layer is at least one of silicon oxide, silicon nitride, or polymer;

etching away sidewalls of the nonconformal layer on sidewalls of the silicon nitride spacers;

trimming the silicon nitride spacers;

removing parts of the nonconformal layer on top of the gates and spacers and on the substrate to provide exposed silicon regions on top of the silicon gates and on the substrate;

depositing a metal layer; and annealing the metal layer to form metal silicide at the exposed silicon regions.

17. The method, as recited in claim 16, wherein the metal layer is at least one of nickel, titanium, cobalt, platinum, or tungsten.

18. The method, as recited in claim 16, wherein the metal layer is nickel and the metal silicide is NiSi.

19. The method, as recited in claim 16, wherein the selectively depositing the nonconformal layer comprises providing a bias greater than 50 volts.

* * * * *